(12) United States Patent
Derderian

(10) Patent No.: US 11,967,576 B2
(45) Date of Patent: Apr. 23, 2024

(54) SYSTEMS FOR THERMALLY TREATING CONDUCTIVE ELEMENTS ON SEMICONDUCTOR AND WAFER STRUCTURES

(71) Applicant: Micron Technology, Inc., Boise, ID (US)

(72) Inventor: James M. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/370,427

(22) Filed: Jul. 8, 2021

(65) Prior Publication Data
US 2021/0335741 A1    Oct. 28, 2021

Related U.S. Application Data

(62) Division of application No. 15/898,019, filed on Feb. 15, 2018, now Pat. No. 11,081,458.

(51) Int. Cl.
*H01L 23/00* (2006.01)
*B23K 1/005* (2006.01)
(Continued)

(52) U.S. Cl.
CPC ............ *H01L 24/11* (2013.01); *B23K 1/0056* (2013.01); *H01L 21/268* (2013.01); *H01L 21/67115* (2013.01); *H01L 21/67248* (2013.01); *H01L 21/6836* (2013.01); *H01L 21/78* (2013.01); *H01L 24/94* (2013.01); (Continued)

(58) Field of Classification Search
CPC ... H01L 24/11; H01L 21/268; H01L 21/6836; H01L 21/78; H01L 21/67248; H01L 24/94; H01L 21/67115; H01L 2221/68327; H01L 2224/11849; H01L 2224/117; H01L 24/10–17; H01L 21/68778;
(Continued)

(56) References Cited

U.S. PATENT DOCUMENTS 6,472,239 B2   10/2002   Hembree et al.
6,600,171 B1   7/2003    Farnworth et al.
(Continued)

FOREIGN PATENT DOCUMENTS

| | | |
|---|---|---|
| CN | 104795363 A | 7/2015 |
| EP | 0999729 A3 | 2/2004 |
| EP | 0999729 B1 * | 8/2011 |

OTHER PUBLICATIONS

EP-0999729-B1 english translation, Alavi Mani Dr Rer Nat Dipl-Ing et al. pp. 1-5, 2011.*
(Continued)

*Primary Examiner* — Latanya N Crawford Eason
(74) *Attorney, Agent, or Firm* — TraskBritt

(57) ABSTRACT

Methods of reflowing electrically conductive elements on a wafer may involve directing a laser beam toward a region of a surface of a wafer supported on a film of a film frame to reflow at least one electrically conductive element on the surface of the wafer. In some embodiments, the wafer may be detached from a carrier substrate and be secured to the film frame before laser reflow. Apparatus for performing the methods, and methods of repairing previously reflowed conductive elements on a wafer are also disclosed.

18 Claims, 7 Drawing Sheets

(51) Int. Cl.
  *B23K 101/40* (2006.01)
  *H01L 21/268* (2006.01)
  *H01L 21/67* (2006.01)
  *H01L 21/683* (2006.01)
  *H01L 21/78* (2006.01)

(52) U.S. Cl.
  CPC  *B23K 2101/40* (2018.08); *H01L 2221/68327* (2013.01); *H01L 2224/117* (2013.01); *H01L 2224/11849* (2013.01)

(58) Field of Classification Search
  CPC ......... H01L 21/68785; H01L 21/68721; H01L 2224/119; B23K 1/0056
  See application file for complete search history.

(56) References Cited

U.S. PATENT DOCUMENTS

| | | | |
|---|---|---|---|
| 6,869,008 B2* | 3/2005 | Inoue | H05K 3/3478 228/245 |
| 7,763,828 B2* | 7/2010 | Talwar | B23K 26/0604 219/121.76 |
| 10,319,706 B2 | 6/2019 | Yoo et al. | |
| 2002/0040521 A1 | 4/2002 | Farnworth et al. | |
| 2003/0209345 A1 | 11/2003 | Zweig | |
| 2004/0072387 A1 | 4/2004 | Hong et al. | |
| 2006/0033118 A1 | 2/2006 | Lee et al. | |
| 2007/0090156 A1 | 4/2007 | Ramanathan et al. | |
| 2008/0102620 A1* | 5/2008 | Sakaguchi | H05K 3/3478 257/E21.508 |
| 2009/0120916 A1 | 5/2009 | Bruce et al. | |
| 2009/0127235 A1 | 5/2009 | Wei et al. | |
| 2013/0084459 A1* | 4/2013 | Larson | C09D 133/16 438/758 |
| 2017/0100794 A1 | 4/2017 | Wu et al. | |
| 2019/0088480 A1 | 3/2019 | Budd et al. | |
| 2019/0189606 A1* | 6/2019 | Kamphuis | H01L 25/50 |
| 2020/0075338 A1 | 3/2020 | Lee et al. | |
| 2021/0379683 A1* | 12/2021 | Azdasht | B23K 1/0056 |

OTHER PUBLICATIONS

English translation of EP-0999729-A3 (Year: 2004).
Chinese First Office Action for Chinese Application No. 201910107543.6, dated Oct. 26, 2022, 17 pages with translation.

* cited by examiner

SYSTEMS FOR THERMALLY TREATING CONDUCTIVE ELEMENTS ON SEMICONDUCTOR AND WAFER STRUCTURES

CROSS-REFERENCE TO RELATED APPLICATION

This application is a divisional of U.S. patent application Ser. No. 15/898,019, filed Feb. 15, 2018, now U.S. Pat. No. 11,081,458, issued Aug. 3, 2021 the disclosure of which is incorporated herein in its entirety by this reference.

FIELD

This disclosure relates generally to semiconductor processing and to methods and apparatus for making and repairing semiconductor devices. More specifically, disclosed embodiments relate to methods and apparatus for reflowing electrically conductive elements on semiconductor devices and wafers comprising semiconductor materials using localized, directed energy.

BACKGROUND

Wafers comprising semiconductor material are employed to fabricate numerous semiconductor devices per wafer from an array of semiconductor device locations on which integrated circuitry is formed, after which semiconductor devices at those locations are separated, or "singulated" as known in the industry. In addition, so-called "reconstituted" wafers comprising an array of previously singulated semiconductor devices secured in a matrix material may be employed to fabricate semiconductor device packages. In either case, wafers may be supported conventionally on carrier substrates during handling and processing to reduce warpage of, and damage to, the wafers from the stresses of handling and processing. For example, the wafers may be supported on, and temporarily secured to, carrier substrates when electrically conductive elements such as solder balls or solder-tipped conductive pillars are formed on surfaces of the wafers, as well as during movement of the wafers through subsequent manufacturing processes and handling. The wafers may remain secured to carrier substrates, for example, when wafers bearing electrically conductive elements are introduced into a furnace for bulk reflow of the electrically conductive elements. Subsequent to reflow, the carrier substrates may be removed from the wafers, which may require using applied force, applied heat, solvents, or combinations or subcombinations of the foregoing techniques.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular wafer, semiconductor device, component thereof, or act in a method of processing and handling a wafer or semiconductor device but are merely idealized representations employed to describe illustrative embodiments. Thus, the drawings are not necessarily to scale.

Disclosed embodiments relate generally to apparatus and methods of reflowing electrically conductive elements on semiconductor devices and wafers comprising semiconductor materials that may increase yield during semiconductor device fabrication, electrically repair individual or groups of conductive elements damaged during semiconductor device fabrication and/or handling, and reduce cost of fabrication and wafer handling. More specifically, disclosed are embodiments of methods of assembling, handling, and processing wafers comprising semiconductor materials that may enable solder reflow while the wafers are supported on, and temporarily secured to, a film frame, rather than a carrier substrate, or even while semiconductor devices singulated from a wafer are unsecured to any support structure. The apparatus and methods described in this disclosure may also reduce or even eliminate the need for costly, resource-consuming, and potentially damaging carrier substrates and their associated handling and removal techniques.

As used in this disclosure, the terms "substantially" and "about" referring to a given parameter, property, or condition mean and include to a degree that one skilled in the art would understand that the given parameter, property, or condition is met with a small degree of variance, such as within acceptable manufacturing tolerances. For example, a parameter that is substantially or about a specified value or condition may be at least about 90% the specified value or condition, at least about 95% the specified value or condition, or even at least about 99% the specified value or condition.

As used herein, the terms "conductive element" and "electrically conductive element" mean and include a metal or metal alloy material, for example, a solder, susceptible to heat-induced reflow at a temperature between, for example, about 90° C. and about 450° C. The metal or metal alloy material of the conductive element may be in a solid state, or as a mass of metal particles in a binder in the form of a paste. The conductive element may be carried on another conductive structure, such as a bond pad, or on a pillar or stud of a higher melting point metal material.

Figure 1:
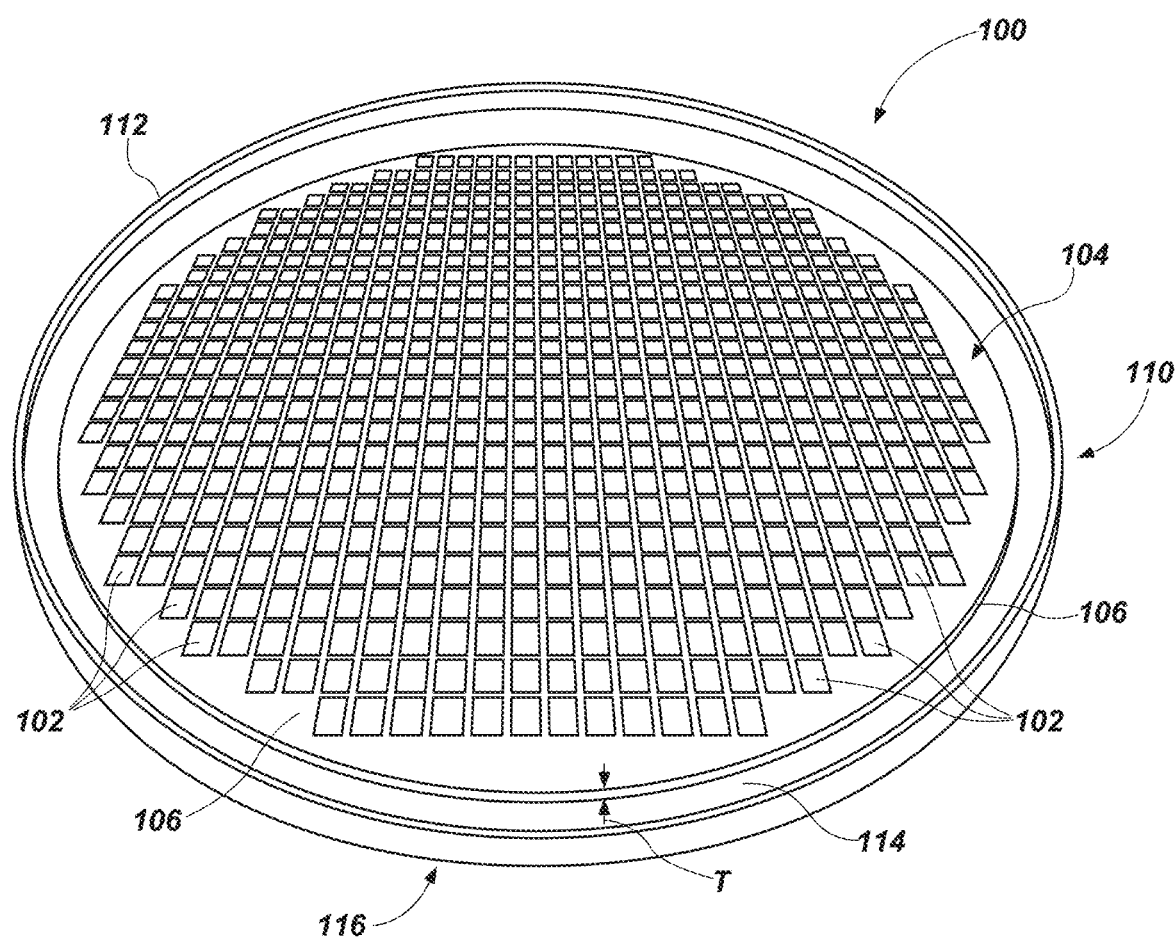
FIG. 1 is a perspective top view of a wafer during a first stage in a method of making semiconductor devices.

FIG. 1 is a perspective top view of a wafer 100 during a first stage in a method of making semiconductor devices. The wafer 100 may comprise a semiconductor material (e.g., silicon) to be further processed into a plurality of semiconductor devices. The wafer 100 may be of any shape, such as, for example, at least substantially disc-shaped or at least substantially a rectangular prism. The wafer 100 may include semiconductor device locations 102, which may include discrete regions of integrated circuitry over and within the active surface 104 of the wafer 100, each discrete region of integrated circuitry being laterally separated from other regions by streets 106. Wafer 100 may be cut (i.e., singulated) to form individual semiconductor devices. In some embodiments, the wafer 100 may comprise only semiconductor material and be configured as a disc. In other embodiments, wafer 100 may comprise a bulk substrate of semiconductor material carried on, for example, a glass or ceramic panel.

In some embodiments, the wafer 100 bearing semiconductor device locations 102 may have been thinned from an initial, far greater thickness, for example, about 600 µm to about 750 µm. For example, a maximum thickness T of the wafer 100 as measured in a direction perpendicular to the active surface 104 of the wafer 100 may be, for example, about 250 µm or less. More specifically, the maximum thickness T of the wafer 100 may be, for example, between about 50 µm and about 250 µm. As a specific, nonlimiting example, the thickness T of the wafer 100 may be between about 50 µm and about 70 µm.

The wafer 100 may be supported on, and temporarily secured to, a film frame 110. The film frame 110 may include, for example, a substantially rigid outer rim 112 at least partially laterally surrounding the wafer 100 and a film 114 bearing an adhesive secured to the outer rim 112 to support the wafer 100 while an inactive surface 116 thereof opposite active surface 104 is adhered to film 114.

Figure 2:
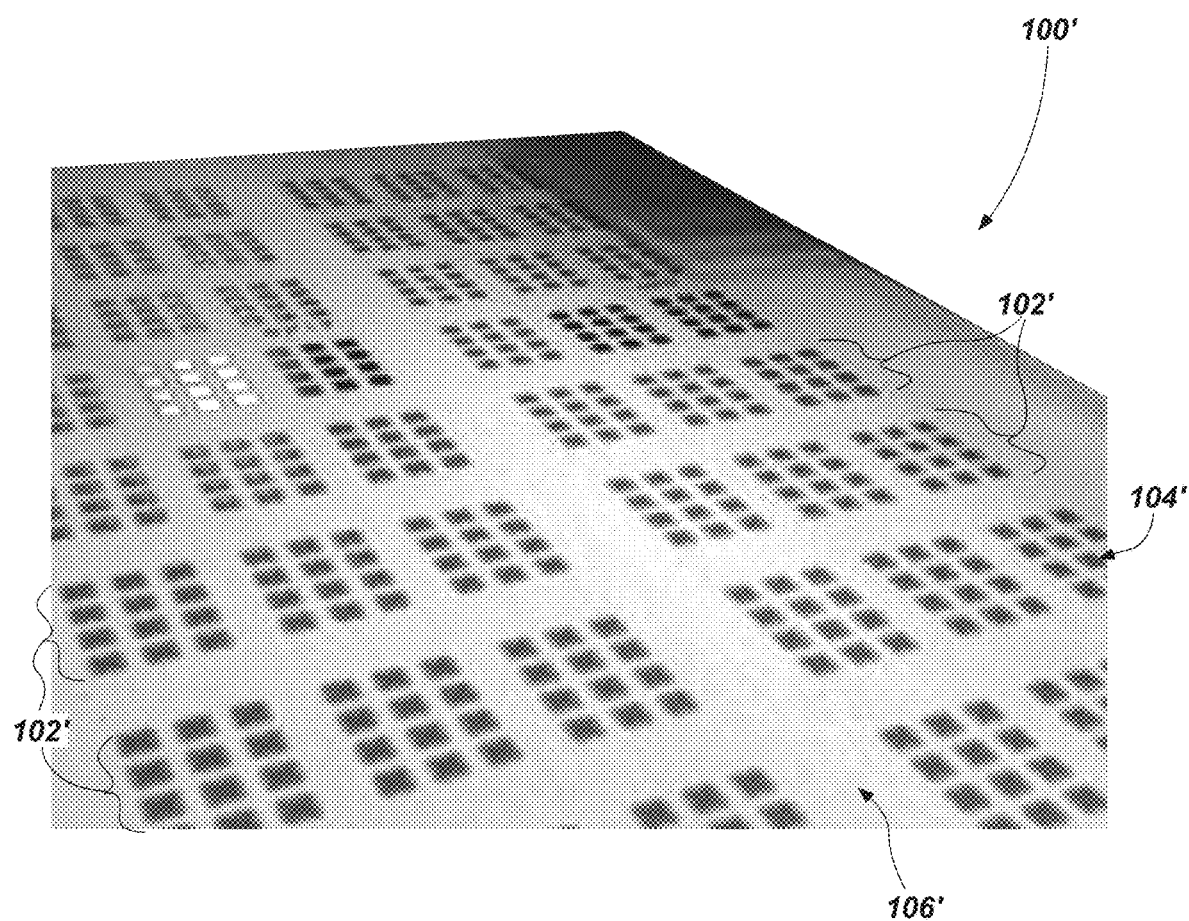
FIG. 2 is a perspective top view of another embodiment of a wafer during the first stage of the method of making semiconductor devices.

FIG. 2 is a perspective top view of another embodiment of a wafer 100' during the first stage of the method of making semiconductor devices. The wafer 100' may be characterized as a "reconstituted" wafer from which Fan-Out-Packages (FoPs) may be fabricated. For example, the wafer 100' may include a polymer material (e.g., an epoxy molding material) located within the portions 106' of the wafer 100' interposed laterally between previously singulated semiconductor devices 102' or groups of such semiconductor devices 102'. Portions 106', being wider than streets 106, provide surface area adjacent to and surrounding semiconductor devices 102' onto which traces extending from bond pad locations may be extended to terminations at a substantially greater pitch. Such a wafer 100' may be characterized as a matrix of the polymer material of the reconstituted portion 106' of the wafer 100 having embedded therein the discrete semiconductor devices 102'.

Figure 3:
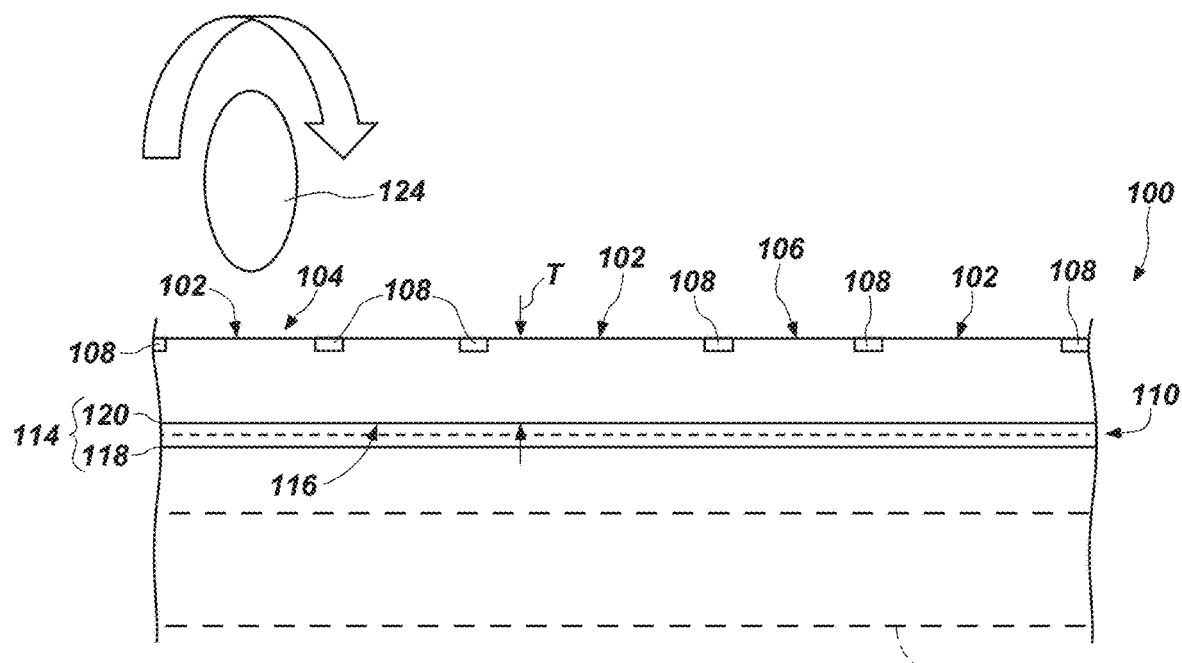
FIG. 3 is a cross-sectional side view representing a portion of a wafer of FIGS. 1 and 2 during a second stage of the method of making semiconductor devices.

FIG. 3 is a cross-sectional side view representing a portion of a wafer 100 or 100' of FIGS. 1 and 2 during a second stage of the method of making semiconductor devices and/or packages. For the sake of clarity, the in-process wafer of either FIG. 1 or FIG. 2 as further described below will be referred to hereinafter as wafer 100, and semiconductor device locations 102 and semiconductor devices 102' as semiconductor device locations 102. Each semiconductor device location 102 may include bond pads 108 operatively connected to at least some of the integrated circuitry of the semiconductor device location 102. The bond pads 108 may include an electrically conductive material, such as, for example, gold or silver, and may be located, for example, along a central longitudinal axis of each semiconductor device location 102, adjacent to opposing sides of each semiconductor device location 102, or a combination thereof.

The film 114 of the film frame 110 may include a backing material 118 located on a side of the film 114 opposite the inactive surface 116 of wafer 100 and an adhesive material 120 located on a side of the film 114 in contact with, and temporarily adhered to, the inactive surface 116. Film 114 may also be characterized in the industry as a "tape." Conventional film backing material may be employed, for example, polyvinyl chloride, polyolefin, or polyethylene, with an adhesive film thereon. As a specific, nonlimiting example, the film 114 may comprise PF-02 tape, commercially available from Nitto, Inc. of Lakewood, NJ.

In some embodiments, the wafer 100 may be supported on the film frame 110 in lieu of support by a carrier substrate 122. For example, the thickness of wafer 100 may be reduced to its final, maximum thickness T (FIG. 1) by, for example, a combination of back grinding and etching while the wafer 100 is held in place by active surface 104 using a vacuum chuck and then transferred directly from the vacuum chuck to the film 114 on film frame 110. In some embodiments, the wafer 100 may remain free from attachment to any carrier substrate 122 throughout formation, handling, and processing. In other embodiments, the wafer 100 may initially be secured to the carrier substrate 122 and may only be supported solely by the film frame 110 after removal from the carrier substrate 122. For example, the carrier substrate 122 may be secured to the inactive surface 116 by an adhesive material 120, which may be exposed to heat while the wafer 100 and the carrier substrate 122 are slid laterally relative to one another to remove the carrier substrate 122 from the wafer 100. Sliding may take place while the wafer 100 is held by a vacuum chuck, from which wafer 100 may be transferred to the film 114 of film frame 110.

In some embodiments, the semiconductor device locations 102 may be separated from one another before any subsequent processing occurs, such as those acts described in connection with FIGS. 4 and 5. For example, a saw 124 may be used to cut through the portions of the streets 106 of the wafer 100 between the semiconductor device locations 102 (e.g., along streets) while the semiconductor device locations 102 remain temporarily secured to the film frame 110. The singulated semiconductor device locations 102 may remain characterized as a wafer 100 even though they have been diced from one another due to their continued, temporary attachment to the film frame in their original positions. In other embodiments, dicing may occur after subsequent processing occurs, such as after completion of the acts described in connection with FIGS. 4 through 9.

Figure 4:
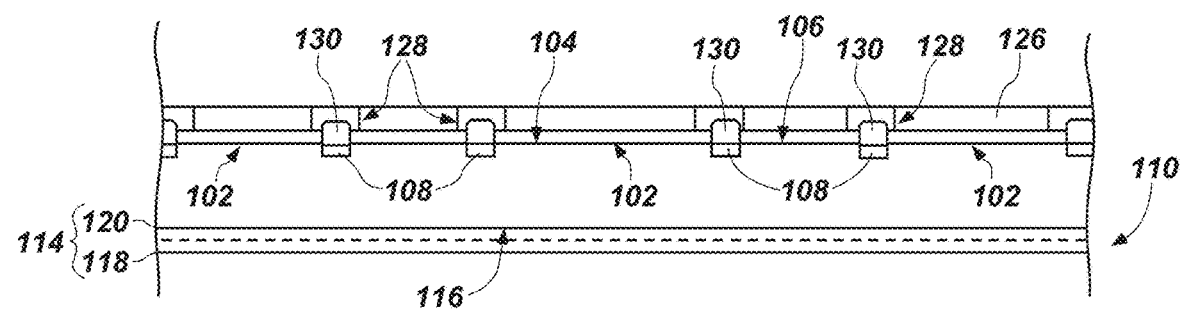
FIG. 4 is a cross-sectional side view representing the portion of the wafer of FIG. 3 during a third stage of the method of making semiconductor devices.

FIG. 4 is a cross-sectional side view representing the portions of the wafer 100 of FIG. 3 during a third stage of the method of making semiconductor devices. In some embodiments, such as that shown in FIG. 4, a first stencil 126 may be positioned proximate to, or in contact with, the active surface 104 of the wafer 100. The first stencil 126 may include, for example, a thin, rigid mask covering a majority of the portions of the streets 106 of the wafer 100 located between the semiconductor device locations 102, as well as the majority of those portions of the semiconductor device locations 102 not occupied by the bond pads 108. More specifically, the first stencil 126 may be a polymeric, metal, or metal alloy plate having holes 128 extending through the first stencil 126, the holes 128 sized, shaped, and arranged to at least substantially align with the bond pads 108. Bond pads 108 may include, for example, so-called "under bump metallization" (UBM) comprising several layers of different metals to enhance bonding of the bond pads 108 to solder. In other instances, conductive pillars of, for example, copper may be formed on bond pads 108, which pillars are to be topped subsequently with solder. In such an instance, the term "bond pad" also means and includes a conductive pillar. In the case of a reconstituted wafer used to form FoPs, prior to singulation of semiconductor device locations 102, conductive traces may be formed extending from bond pads 108 of semiconductor device locations 102 to laterally remote bond pads (not shown) at greater pitch (i.e., spacing) on the polymer material.

Flux material 130 may be placed through the holes 128 onto the bond pads 108. The first stencil 126 may at least substantially mask those portions of the wafer 100 where the flux material 130 is not desired. As the flux material 130 is placed (e.g., deposited as a paste through a nozzle) through the holes 128, it may be at least substantially constrained to those portions of the wafer 100 where it is desired, such as, for example, on the bond pads 108. The flux material 130 may be configured to reduce (e.g., eliminate) oxidation of the bond pads 108 during subsequent processing. In other embodiments, the flux material 130 may be omitted, and the first stencil 126 may not be employed. Instead, other techniques may be employed to prevent oxidation (e.g., by flowing a cover gas, such as argon, over the bond pads 108), or oxides may be removed after formation (e.g., by rinsing the bond pads 108 in formic acid).

Figure 5:
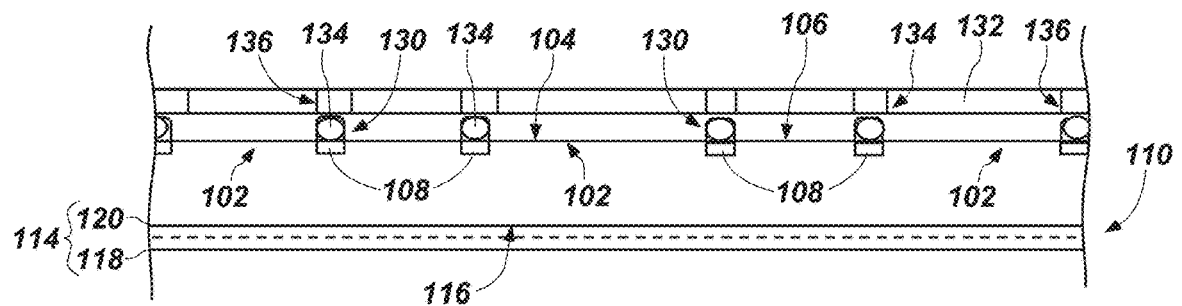
FIG. 5 is a cross-sectional side view representing the portion of the wafer of FIG. 3 during a fourth stage of the method of making semiconductor devices.

FIG. 5 is a cross-sectional side view representing the portion of the wafer of FIG. 3 during a fourth stage of the method of making semiconductor devices. The first stencil 126 may be removed, and a second stencil 132 may be positioned proximate to, or in contact with, the active surface 104 of the wafer 100. The second stencil 132 may include, for example, a thin, rigid mask covering a majority of the portions of the streets 106 of the wafer 100 located between the semiconductor device locations 102, as well as the majority of those portions of the semiconductor device locations 102 not occupied by the bond pads 108. More specifically, the second stencil 132 may be a plate of a material (e.g., stainless steel) selected not to adhere or otherwise bond with electrically conductive elements 134 to be formed on and physically and electrically connected to the bond pads 108. The second stencil 132 may have holes 136 extending through the second stencil 132, the holes 136 sized, shaped, and arranged to at least substantially align with the bond pads 108.

Electrically conductive elements 134 may be placed through the holes 136 into structural and electrical connection with the bond pads 108. The second stencil 132 may at least substantially mask those portions of the wafer 100 where the material of the electrically conductive elements 134 is not desired. As the electrically conductive elements 134 are placed (e.g., dropped in solid form or placed in the form of discrete masses of solder paste) through the holes 136, it may be at least substantially constrained to those portions of the wafer 100 where it is desired, such as, for example, on the bond pads 108. The electrically conductive elements 134 may include, for example, balls, bumps, or other masses of electrically conductive material (e.g., solder comprising a metal, a metal alloy, or a metal or metal alloy suspended in a binder paste). In embodiments where the wafer 100 is diced into singulated semiconductor device locations 102, the optional placement of flux material 130 and the placement of the electrically conductive elements 134 may take place before singulation. That is, the acts depicted in FIGS. 4 and 5 may take place before the acts depicted in FIG. 3. In some such embodiments, the wafer 100 may be temporarily secured to, and supported on, a carrier substrate 122 (see FIG. 3), rather than the film frame 110, during the placement of flux material 130 and electrically conductive elements 134.

Figure 6:
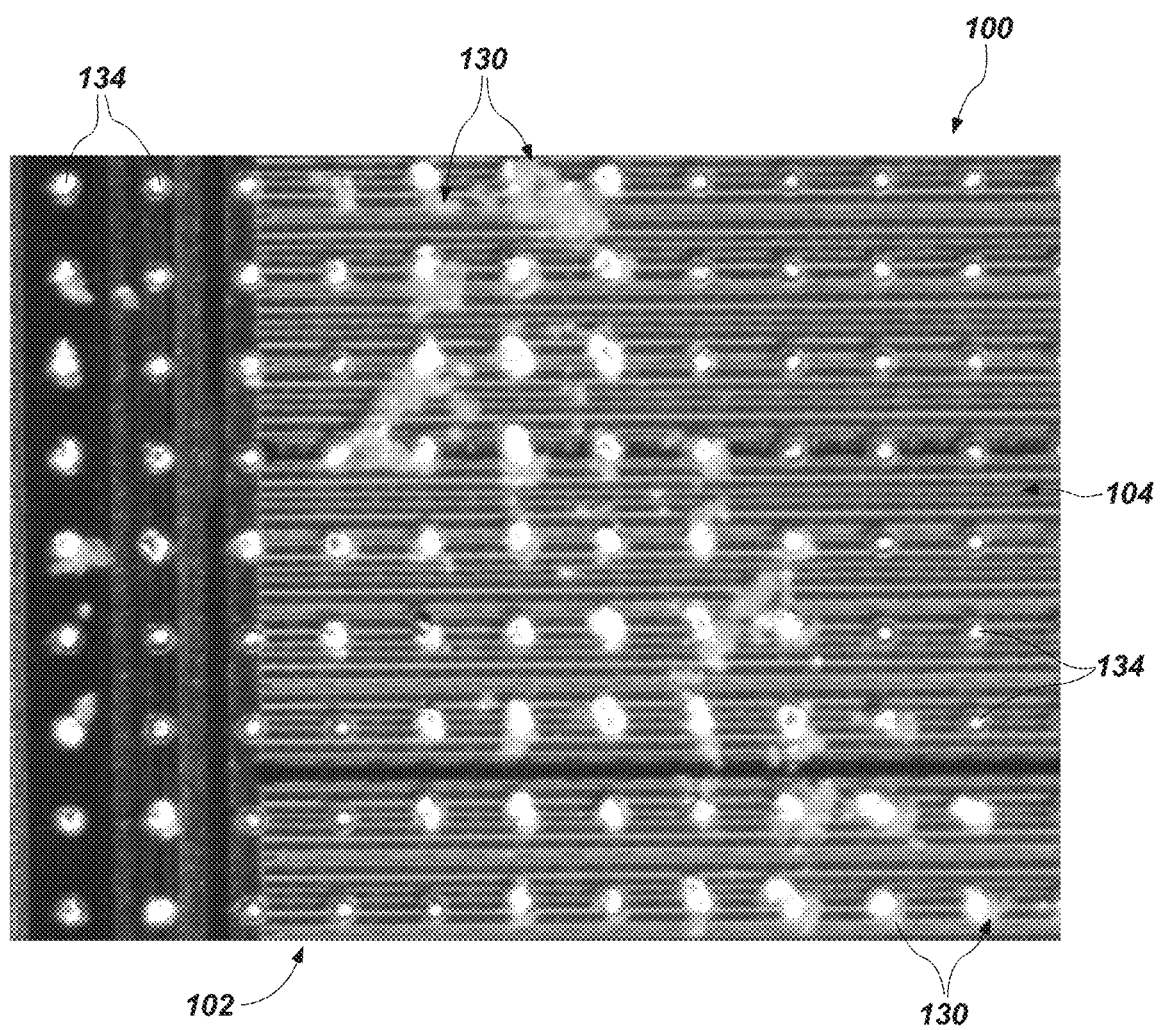
FIG. 6 is a top view photograph of portions of wafers produced in accordance with the foregoing methods after completing the third and fourth stages shown in FIGS. 4 and 5.

FIG. 6 is a top view photograph of portions of wafers produced in accordance with the foregoing methods after completing the third and fourth stages shown in FIGS. 4 and 5 and removing the second stencil 132 (see FIG. 5). As shown in FIG. 6, some of the flux material 130, the material of the electrically conductive elements 134, or the flux material 130 and the material of the electrically conductive elements 134 may tend to displace beyond the intended confines of the bond pads 108 and cover portions of the active surface 104 of semiconductor device locations 102. These materials may corrode the semiconductor material of the semiconductor device locations 102, which may undesirably damage the integrated circuitry embedded in active surface 104. The flux material 130 and/or electrically conductive elements 134 may also attract and retain particulates (e.g., dust), which may undesirably abrade and damage the integrated circuitry of the semiconductor device locations 102.

One technique to reduce (e.g., eliminate) the undesirable effects of the migration of the flux material 130 and/or the material of the electrically conductive elements 134 is to reflow the material of the electrically conductive elements 134 according to embodiments of the disclosure. Reflowing the material of the electrically conductive elements 134 may burn off excess flux material 130, and the wettability of the material of the electrically conductive elements to the bond pads 108 may cause the material of the electrically conductive elements 134 to migrate back toward the bond pads 108. However, conventional techniques for reflowing electrically conductive elements typically involve placing the wafer 100, including the semiconductor device locations 102, the other portions of the streets 106, and the electrically conductive elements 134 into a furnace to expose the entire assembly to elevated temperature. To enable transport of the wafer 100, and to withstand the elevated temperatures of the furnace, bulky, resilient carrier substrates 122 (see FIG. 3) have conventionally been temporarily secured to the wafer 100. The carrier substrates 122 tend to be expensive to make, and the process of detaching them from the wafers 100 may reintroduce damage to the electrically conductive elements 134. For example, when forcing the carrier substrate 122 and wafer 100 laterally relative to one another, the separation forces may act on the electrically conductive elements 134, causing them to deform. Deforming the electrically conductive elements 134 may cause them to form electrical short circuits with the integrated circuitry of the active surface 104, to exhibit differing heights, or to fail to form desired electrical connections with the integrated circuitry of the active surface 104 or with another device or structure.

Figure 7:
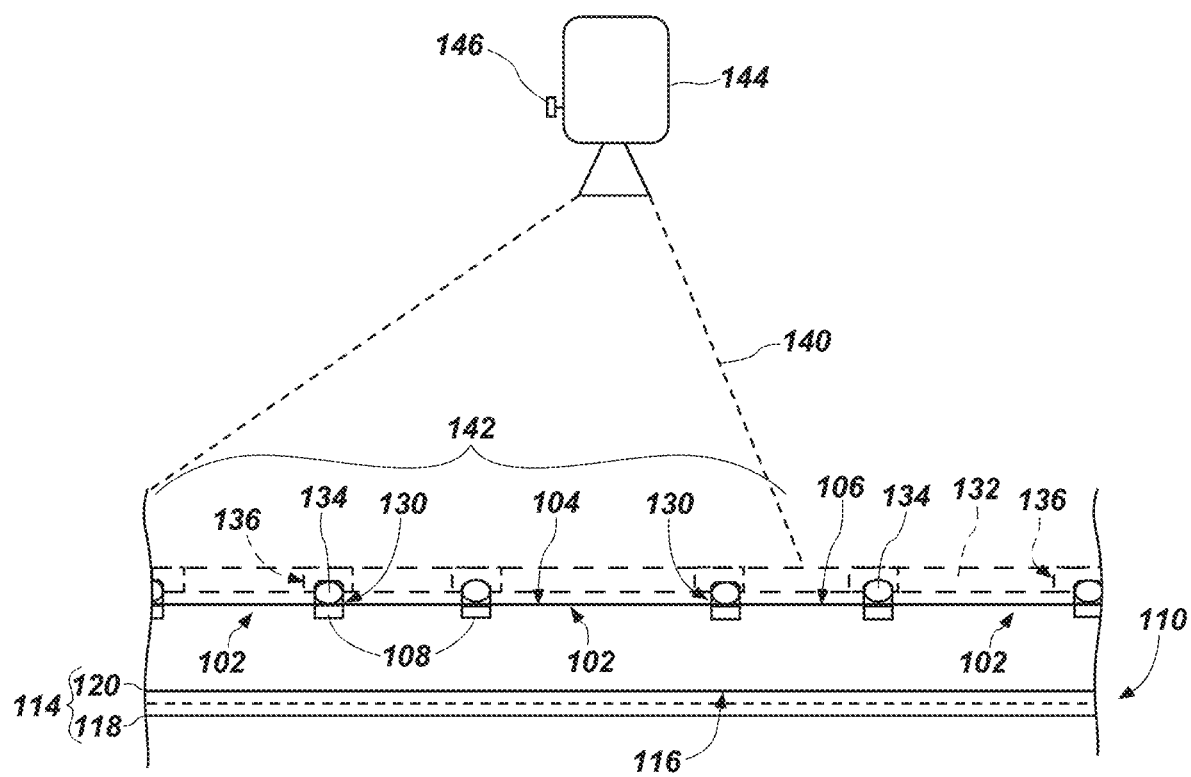
FIG. 7 is a cross-sectional side view representing the portion of the wafer of FIG. 3 during a fifth stage of the method of making semiconductor devices.

FIG. 7 is a cross-sectional side view representing the portions of the wafers 100 of FIG. 3 during a fifth stage of the method of making semiconductor devices. To reflow the material of the electrically conductive elements 134, a laser beam 140 may be directed toward a region 142 of the active surface 104 of the wafer 100 while the wafer 100 is supported on the film 114 supported by film frame 110. Unlike a conventional furnace, the energy of the laser beam 140 may not be at least substantially equally absorbed on all sides of the wafer 100. Rather, the laser beam 140, and the localized heat the laser beam 140 generates, may be concentrated on the active surface 104, leaving the inactive surface 116 and the film 114 underlying the inactive surface 116 at lower temperatures than those experienced at the active surface 104. As a result, the heat from the laser beam 140 may not substantially damage film 114 or degrade the temporary attachment between the film 114 and the wafer 100, avoiding the requirement for a bulk furnace reflow of electrically conductive elements 134 and the necessity of using a carrier substrate.

The laser beam 140 may be emitted by a laser apparatus 144 having, for example, variable length and width (in the x-y plane of wafer 100) parameters for the laser beam 140 implemented by beam-shaping optics. For example, a surface area of the region 142 irradiated by the laser beam 140 may be about 1,600 mm$^2$ or less. More specifically, the surface area of the region 142 irradiated by the laser beam 140 may be, for example, between about 1 mm$^2$ and about 1,600 mm$^2$. As specific, nonlimiting examples, the surface area of the region 142 irradiated by the laser beam 140 may be, for example, between about 100 mm$^2$ and about 1,000 mm$^2$, between about 100 mm$^2$ and about 800 mm$^2$, or between about 400 mm$^2$ and about 600 mm$^2$. As shown in FIG. 7, the surface area of the region 142 may be large enough that the laser beam 140 may actively irradiate the electrically conductive elements 134 of more than one semiconductor device location 102 at a time. For example, the laser beam 140 may irradiate two, four, or portions of two or four semiconductor device locations 102 at a time to increase the speed at which the electrically conductive elements 134 on wafer 100 may all be reflowed. In other embodiments, the surface area may be smaller, targeting on a semiconductor device location 102, only a portion of a semiconductor device location 102, or even on a single electrically conductive element 134. The surface area may be adjustable by the laser apparatus 144, and adjustment may take place before irradiation begins, while irradiation is actively occurring, or both. Suitable equipment for controlling operation of the laser apparatus 144, is commercially available from CrucialTec of 62, 255beon-gil, Pangyo-ro, Bundang-gu, Seongnam-si, Gyeonggi-do, Korea.

One suitable laser apparatus employs an Nd:Yag crystal. An average power at which the laser beam 140 is emitted may be, for example, about 120 W or less. More specifically, the average power at which the laser beam 140 is emitted may be, for example, between about 40 W and about 120 W. As specific, nonlimiting examples, the average power at which the laser beam 140 irradiates the region 142 may be between about 50 W and about 100 W or between about 60 W and about 80 W. The power may be adjustable by the laser apparatus 144, and adjustment may take place before irradiation begins, while irradiation is actively occurring, or both. It is desirable that the selected wavelength be readily absorbed by the particular solder employed on the target wafer to minimize reflectance and power level employed.

The laser beam 140 may exhibit a wavelength in an infrared or a visible green region of a spectrum. For example, a wavelength of the laser beam 140 may be between about 400 nm and about 1.5 mm. More specifically, the wavelength of the laser beam 140 may be between about 500 nm and about 1 mm. As specific, nonlimiting examples, the wavelength of the laser beam 140 may be between about 500 nm and about 900 nm or between about 600 nm and about 800 nm. Suitable equipment for the laser apparatus 144 itself and its optical components is commercially available from Laserline GmbH of Fraunhofer Straße 56218 Mülheim-Karlich/Germany. When performing tests, a laser apparatus 144 from this vendor was used, with a maximum power rating of 1,000 W and a wavelength of about 1 mm.

The laser beam 140 may be directed toward the region 142 for a duration of, for example, about 1.5 seconds or less. More specifically, the laser beam 140 may irradiate the region 142 for between, for example, about 0.1 second and about 1.5 seconds. As specific, nonlimiting examples, the laser beam 140 may irradiate the region 142 for between about 0.25 second and about 1.25 seconds or between about 0.5 second and 1 second.

The laser apparatus 144 may include a temperature sensor 146 configured to measure and monitor a temperature of at least a portion of the region 142 irradiated by the laser beam 140. By monitoring the real-time temperature of the region 142, or a portion thereof, the intensity, size, and duration of the radiation from the laser beam 140 can be adjusted in real-time to reduce (e.g., eliminate) the likelihood that the radiation will damage the wafer 100 or film 114, or detach the wafer 100 from the film 114 of film frame 110. The temperature sensor 146 may include, for example, an infrared temperature sensor. In addition to, or instead of, adjusting the intensity, size, and duration of emission, the laser apparatus 144 may pulse the laser beam 140. In some embodiments, the second stencil 132 may be left in place between the laser apparatus 144 and the wafer 100 when irradiating the region 142 with the laser beam 140. The second stencil 132 may function as a heat sink to absorb, reflect, or redirect a majority of the radiation in those regions that the second stencil 132 covers, reducing heat and potential damage to the film 114 and wafer 100, while permitting radiation from the laser beam 140 to directly access the optional flux material 130 and the electrically conductive elements 134 through holes 136.

EXAMPLES

In one example, damaged solder bumped dice were exposed to a laser beam from the aforementioned Laserline apparatus. The dice were carried on a tape frame with Nitto PF-02 tape. When a single die exposure (10 mm×14 mm) was employed for solder bump reflow, with a laser power of 50 W for a time of 0.5 second, and an infrared temperature sensor output indicating 220° C. wafer surface temperature, no tape damage was observed. When laser power was reduced to 40 W and time increased to 1.5 seconds, the infrared temperature sensor output indicated 360° C. wafer surface temperature and light bubbling of the tape was observed, as shown at B on FIG. 10.

In another example, damaged solder bumped dice were exposed to a laser beam from the aforementioned Laserline apparatus. The dice were carried on a tape frame with Nitto PF-02 tape. When a four-die exposure (25 mm×16 mm) was employed for solder bump reflow, with a laser power of 120 W for a time of 0.5 second, and an infrared temperature sensor output indicating 265° C. wafer surface temperature, no tape damage was observed, as shown at ND on FIG. 10. When laser power was maintained at 120 W and time increased to 1.0 second, the infrared temperature sensor output indicated 360° C. wafer surface temperature and a slight change in tape transparency was observed.

While embodiments of the disclosure have been described in the context of application heat for localized reflow of conductive elements, for example solder balls, other embodiments of the disclosure are equally suitable for repair of conductive elements previously reflowed in a furnace while on a carrier substrate. As a result of a furnace reflow, the process of subsequently removing a wafer bearing the reflowed conductive elements from a carrier substrate, or indentations on conductive elements resulting from inspection, some conductive elements may vary in height from tolerances, be deformed, or partially separated from an associated bond pad. Such damaged or partially separated conductive elements may, after the wafer is removed from the carrier substrate and adhered to a film of a film frame, be selectively reflowed using techniques of the disclosure. Such selective reflow may be enhanced using a high-resolution camera of a machine vision system in association with a processor of control equipment controlling the laser apparatus to identify substandard, defective conductive elements and conductive element locations so that a majority of a bulk-reflowed wafer need not be laser treated. For example, dimensional tolerances for conductive elements and deviation from acceptable locational tolerances may be preprogrammed, or a lookup table of images of unacceptable conductive element configurations and deviations from acceptable locational tolerances.

Accordingly, methods of reflowing electrically conductive elements on a wafer may involve directing a laser beam toward at least one region of a surface of a wafer including a semiconductor material. At least one electrically conductive element on the surface of the wafer in region or regions may be reflowed in response to applied energy from the laser beam.

As another example embodiment, methods of reflowing electrically conductive elements on a wafer may involve detaching a wafer including a semiconductor material from a carrier substrate supporting the wafer. The wafer may be secured to a film with electrically conductive elements on a surface of the wafer facing away from the film. A laser beam may be directed toward a region of the surface of the wafer. At least some of the electrically conductive elements on the surface of the wafer in the region may reflow in response to applied energy from the laser beam.

As still another example embodiment, methods of repairing conductive elements on one or more semiconductor structures may involve directing a laser beam toward previously reflowed conductive elements on one or more semiconductor structures, the previously reflowed conductive elements having been determined to be defective. The defective conductive elements may be reflowed again.

As yet another example embodiment, systems for thermally treating conductive elements on semiconductor structures may include apparatus for generating a laser beam in the infrared or visible green spectrum, the apparatus configured to selectively adjust a surface area of irradiation. Apparatus for controlling a path of the laser beam may be operably coupled to the apparatus for generating a laser beam. An infrared temperature sensor may be configured to measure a temperature of a surface during irradiation by the laser beam. A film for supporting a semiconductor structure with a surface bearing one of preformed conductive elements or discrete masses of conductive element material in a binder while a laser beam generated by the apparatus for generating the laser beam irradiates the surface of the semiconductor structure may also be included.

Figure 8:
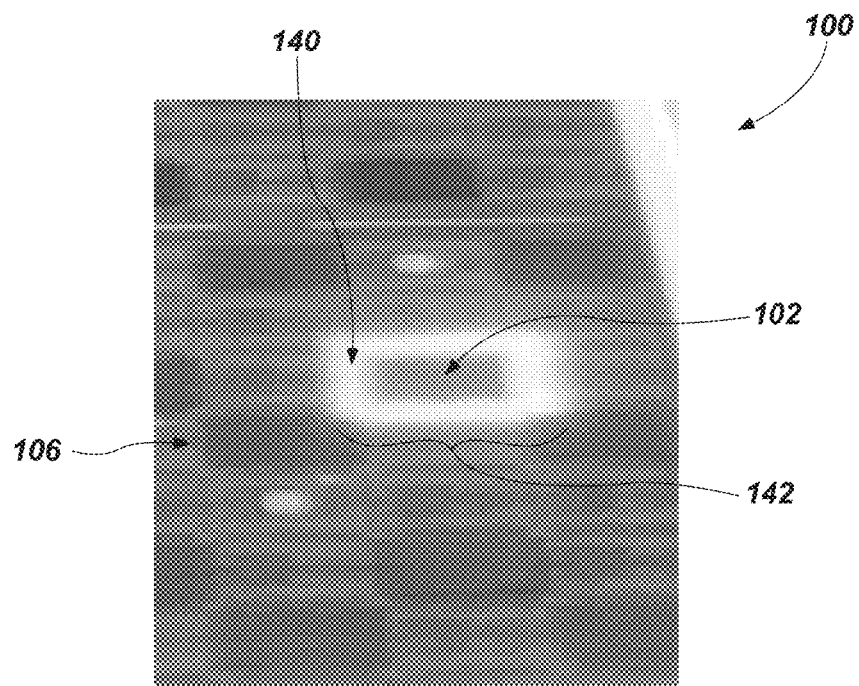
FIG. 8 is a top view photograph of portions of the wafers produced by the methods of FIGS. 1 through 6 during another embodiment of the fifth stage of the method of making semiconductor devices.

FIG. 8 is a top view photograph of portions of the wafers 100 produced by the methods of FIGS. 1 through 6 during another embodiment of the fifth stage of the method of making semiconductor devices. As shown in FIG. 8, the surface area of the region 142 irradiated by the laser beam 140 may at least substantially correspond to the surface area of a single semiconductor device location 102. In still other embodiments, the surface area of the region 142 may be less than the surface area of one semiconductor device location 102, including targeting a subset of electrically conductive elements 134 (see FIG. 7) or even a single electrically conductive element 134 (see FIG. 7) at a time.

Figure 9:
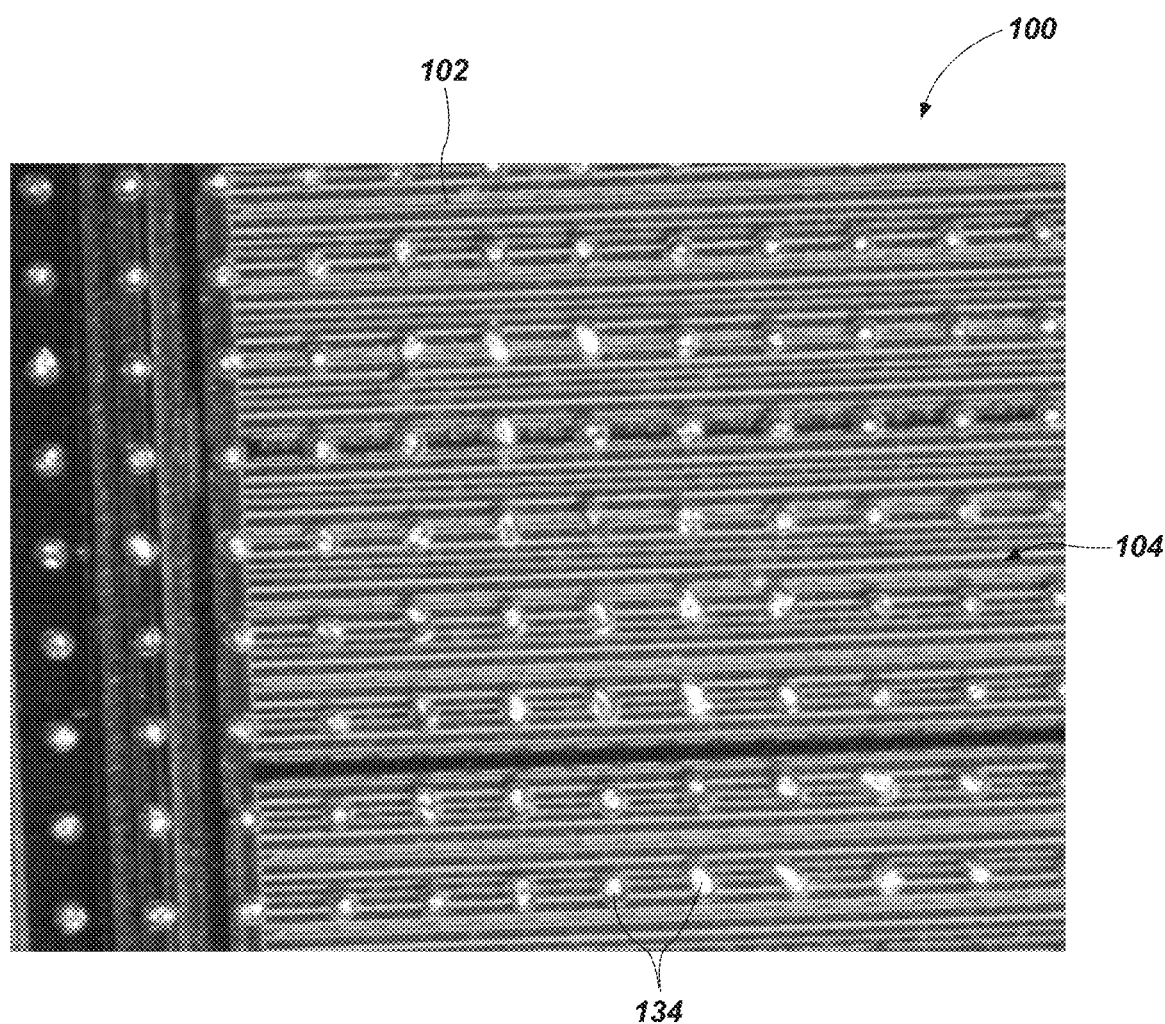
FIG. 9 is a top view photographing portions of a wafer produced by the methods of FIGS. 1 through 8 after completing the fifth stage shown in FIGS. 7 and 8.

FIG. 9 is a top view photographing portions of wafers 100 produced by the methods of FIGS. 1 through 8 after completing the fifth stage shown in FIGS. 7 and 8. The degree to which the electrically conductive elements 134 align with and more closely match the size and shape of the underlying bond pads 108 (see FIG. 7) in comparison to FIG. 6 is visibly evident. In addition, the incidence of flux material 130 in comparison to FIG. 6 is reduced. In some embodiments, to further facilitate removal of the flux material 130, a solvent may be flowed over the active surface 104 subsequent to laser treatment. For example, a water wash may be flowed over the active surface to remove at least some remaining flux material 130.

Figure 10:
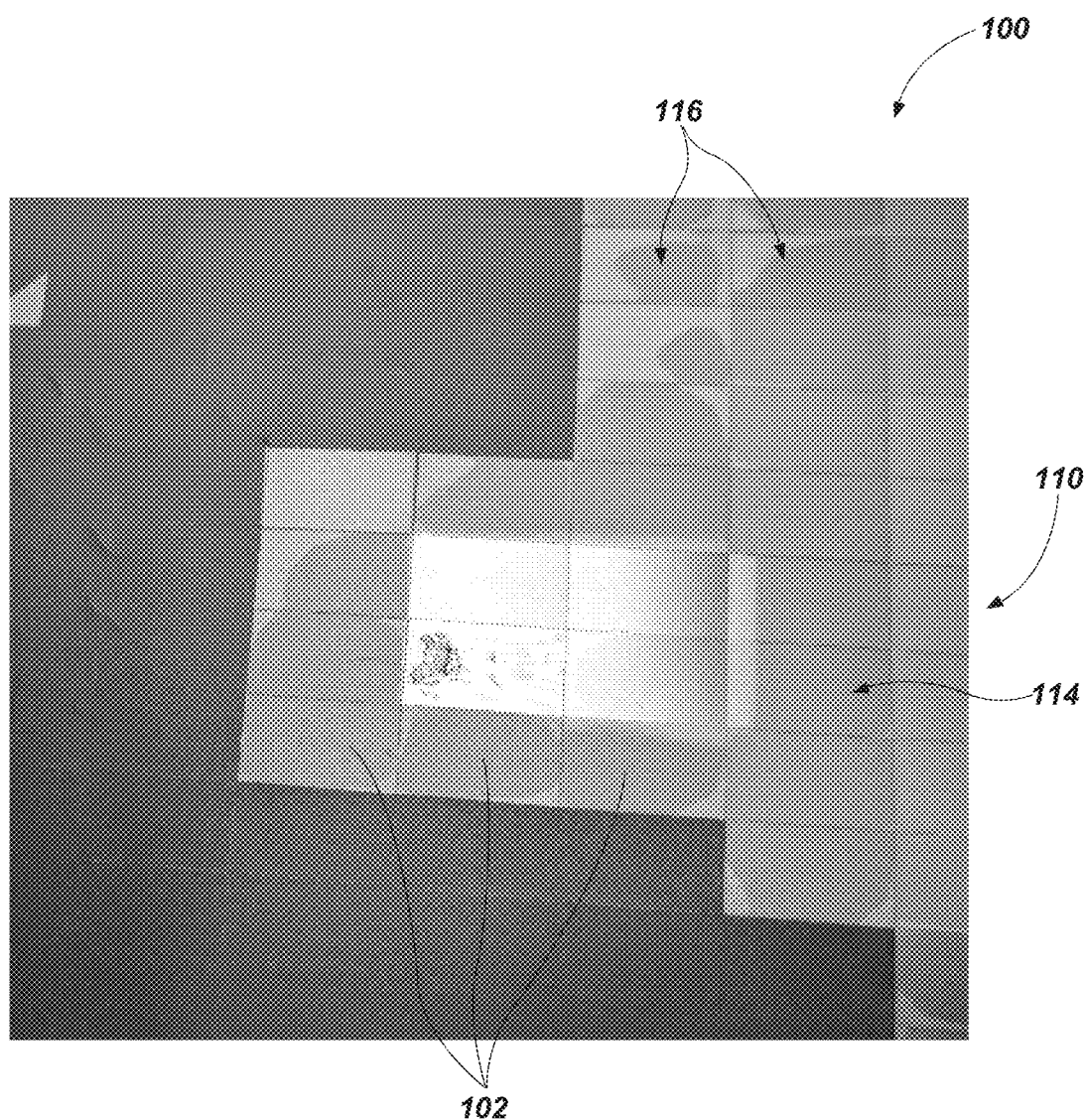
FIG. 10 is a perspective bottom view photographing portion of a wafer post-reflow of conductive elements by the foregoing methods.

FIG. 10 is a perspective bottom view photograph of a portion of a wafer 100 produced by the foregoing methods. As shown in FIG. 10, some pockets of gas, shown as bubbles B in FIG. 10, may form between the film 114 of the film frame 110 and the inactive surface 116 of the wafer 100 when the laser beam 140 (see FIG. 8) is directed toward the wafer 100. However, the visible bubbles between the film 114 of the film frame 110 and the inactive surface 116 of the wafer 100 did not result in complete release of the wafer, or any semiconductor device location 102 thereof, from the film frame 110. The film 114 of film frame 110 remained capable of supporting, and remaining temporarily secured to, the wafer 100 during subsequent processing, such as, for example, dicing as described previously in connection with FIG. 3, although conducted after the acts of FIGS. 7 through 9.

Figure 11:
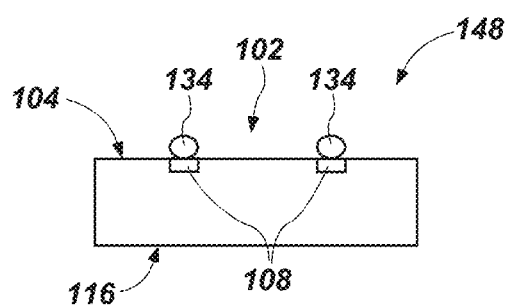
FIG. 11 is a schematic cross-sectional side view of a semiconductor device produced by the methods of FIGS. 1 through 10.

FIG. 11 is a cross-sectional side view of a semiconductor device 148 produced by the methods of FIGS. 1 through 10. The semiconductor device 148 includes a semiconductor device location 102 that has been singulated from the rest of the wafer 100. The semiconductor device 148 includes bond pads 108 at the active surface 104 of the semiconductor device 148, and electrically conductive elements 134 directly physically and electrically connected to the bond pads 108. The semiconductor device 148 may be at least substantially free of flux material 130 (see FIG. 8). In some embodiments, the semiconductor device 148 may remain free from temporary attachment to a carrier substrate 122 (see FIG. 9) during all processing acts from thinning to singulation and reflow. Although the semiconductor device 148 shown in FIG. 11 is depicted with a single semiconductor die, semiconductor devices 148 including multiple dice can also be produced in accordance with this disclosure. For example, the semiconductor device locations 102 depicted in FIG. 2 can be singulated to produce an array of laterally adjacent semiconductor dice. As another example, a semiconductor device location 102 may include vertically stacked semiconductor dice.

The semiconductor device 148 may be produced by performing a dicing operation if the wafer 100 (see FIG. 10) has not yet been diced. If the wafer 100 (see FIG. 10) has been singulated, the semiconductor devices 148 may be pulled away from the film frame 110 (see FIG. 10), detaching the temporary bond with the film 114 (see FIG. 10) of the film frame 110 (see FIG. 10). More specifically, a pick-and-place machine may grasp individual semiconductor devices 148 and pull them away from the film frame (see FIG. 10), producing semiconductor devices 148 ready for any further processing (e.g., overmolding) or attachment to another device or structure (e.g., integration into a larger package or attachment to another system).

As still other embodiments, the laser-driven reflow of electrically conductive elements disclosed herein may be employed on individual semiconductor dice, rather than at the wafer level. For example, the individual semiconductor dice may be supported on any underlying substrate, regardless of whether the semiconductor dice are temporarily secured to the underlying substrate. More specifically, the semiconductor dice may be supported on, and temporarily secured to, a film frame, or the semiconductor dice may simply be supported on an underlying surface without adhering or otherwise securing the semiconductor dice to the surface. The laser beam may then be directed toward one or more of the semiconductor dice to reflow the electrically conductive elements thereof. In one implementation, semiconductor devices disposed in a shipping tray may be subjected to a final optical inspection by a high-resolution camera of a machine vision system operably coupled to control equipment for a laser apparatus, and defective conductive elements may be repaired in the tray immediately prior to shipping or prior to additional assembly processing.

Methods of handling wafers, processing wafers, and reflowing electrically conductive elements on wafers in accordance with this disclosure may reduce (e.g., eliminate) the need for carrier substrates and the stresses and temperatures associated with removing the carrier substrates. In addition, the disclosed methods may replace the more expensive, more difficult-to-use carrier substrate with a less expensive, easier-to-use film frame. Moreover, the disclosed methods may more efficiently reflow electrically conductive elements utilizing targeted, laser-based energy that is adjustable in real-time based on sensed conditions during reflow. In addition, embodiments of the disclosure may be used for post furnace-reflow and/or post-inspection repair of individual conductive elements or groups of conductive elements.

Embodiments of the disclosure may increase yield, enhance product quality, reduce cost through elimination or reduction of use of carrier substrates, eliminate conventional furnace-implemented conductive element reflow, and reduce time and temperature of thermal exposure of wafers and semiconductor devices.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventor.

What is claimed is:

1. A system for thermally treating conductive elements on a semiconductor structure, the system comprising:
 apparatus for generating a laser beam in an infrared or visible green spectrum, the apparatus configured to selectively adjust a surface area of irradiation;
 apparatus for controlling a path of the laser beam operably coupled to the apparatus for generating the laser beam;
 an infrared temperature sensor configured to measure a temperature of a surface during irradiation by the laser beam;
 a first stencil having first holes sized and positioned to at least substantially align with bond pads of a semiconductor structure, the first stencil configured to enable flux to be deposited on the bond pads and to mask other portions of the semiconductor structure;
 a second stencil having second holes sized and positioned to permit discrete masses of conductive element material to pass through the second holes and contact the flux, the second stencil configured to be positioned proximate to the semiconductor structure following removal of the first stencil, the second stencil comprising a material non-wettable by the discrete masses of conductive element material; and
 a film supported from an outer rim of a film frame, the film comprising a polymer backing material bearing an adhesive for supporting the semiconductor structure with a surface bearing the discrete masses of conductive element material in the flux, the surface located on a side of the semiconductor structure opposite the film when the semiconductor structure is supported on the film, while the second stencil is located proximate to the surface and while a laser beam generated by the apparatus for generating the laser beam irradiates the surface of the semiconductor structure to reflow at least one of the discrete masses of conductive element material in the flux in response to applied energy from the laser beam, the second stencil further configured as a heat sink to absorb, reflect, or redirect heat from the laser beam,
 wherein the apparatus for generating the laser beam, the apparatus for controlling the path of the laser beam, and the infrared temperature sensor are configured to maintain a temperature of the surface irradiated by the laser beam and detectable by the infrared temperature sensor at about 360° C. or less.

2. The system of claim 1, wherein the film comprises a tape.

3. The system of claim 1, wherein the polymer backing material comprises polyvinyl chloride, polyolefin, or polyethylene.

4. The system of claim 1, wherein the apparatus for controlling the path of the laser beam and the infrared temperature sensor are configured to temporarily maintain an adhesive bond between the film and the semiconductor structure after reflowing the at least one of the discrete masses of conductive element material in the flux.

5. The system of claim 1, wherein the apparatus for generating the laser beam is configured to irradiate a surface area of the surface of the semiconductor structure of about 1,600 mm$^2$ or less utilizing the laser beam.

6. The system of claim 5, wherein the apparatus for generating the laser beam is configured to selectively adjust the surface area irradiated by the laser beam to apply heat to reflow one of the discrete masses of conductive element material, including the at least one of the discrete masses of conductive element material, in the flux or to simultaneously reflow a group of the discrete masses of conductive element material, including the at least one of the discrete masses of conductive element material, in the flux.

7. The system of claim 1, wherein the apparatus for generating the laser beam is configured to emit the laser beam at an average power of about 120 W or less.

8. The system of claim 1, wherein the apparatus for generating the laser beam is configured to pulse the laser beam while directing the laser beam toward the surface of the semiconductor structure.

9. The system of claim 1, wherein the second stencil comprises a stainless steel material.

10. The system of claim 1, wherein the first stencil comprises a first polymeric, metal, or metal alloy plate having the first holes extending through the first polymeric, metal, or metal alloy plate and wherein the second stencil comprises a second polymeric, metal, or metal alloy plate having the second holes extending through the second polymeric, metal, or metal alloy plate.

11. The system of claim 1, further comprising apparatus for placing a flux material on the surface of the semiconductor structure.

12. The system of claim 1, wherein the semiconductor structure comprises semiconductor device locations on the surface of the semiconductor structure and further comprising a saw configured to dice the semiconductor structure between the semiconductor device locations.

13. A system for reflowing conductive elements on a wafer structure, the system comprising:
   a laser for generating a laser beam in an infrared or visible green spectrum, the laser configured to selectively adjust a surface area of irradiation;
   apparatus for controlling a path of the laser beam operably coupled to the laser;
   an infrared temperature sensor positioned, oriented, and configured to measure a temperature of a surface during irradiation by the laser beam;
   a first stencil having first holes sized and positioned to at least substantially align with bond pads of a wafer structure, the first stencil configured to enable flux to be deposited on the bond pads and to mask other portions of the wafer structure;
   a second stencil having second holes sized and positioned to permit discrete masses of conductive element material to pass through the second holes and contact the flux, the second stencil configured to be positioned proximate to the wafer structure following removal of the first stencil, the second stencil comprising a material non-wettable by the discrete masses of conductive element material; and
   a film supported from an outer rim of a film frame, the film comprising a polymer backing material bearing an adhesive configured to support the wafer structure with a surface bearing the discrete masses of conductive element material in the flux, the surface located on a side of the wafer structure opposite the film when the wafer structure is supported on the film, while the second stencil is located proximate to the surface and while the laser beam generated by the laser irradiates the surface of the wafer structure to reflow at least one of the discrete masses of conductive element material in the flux in response to applied energy from the laser beam, the second stencil further configured as a heat sink to absorb, reflect, or redirect heat from the laser beam,
   wherein the laser, the apparatus for controlling the path of the laser beam, and the infrared temperature sensor are configured to maintain a temperature of the surface irradiated by the laser beam and detectable by the infrared temperature sensor at about 360° C. or less.

14. The system of claim 13, wherein the apparatus for controlling the path of the laser beam and the infrared temperature sensor are configured to temporarily maintain an adhesive bond between the film and a semiconductor structure after reflowing the at least one of the discrete masses of conductive element material in the flux.

15. The system of claim 13, wherein the laser is configured to irradiate a surface area of a surface of a semiconductor structure of about 1,600 mm$^2$ or less utilizing the laser beam.

16. The system of claim 15, wherein the laser is configured to selectively adjust the surface area irradiated by the laser beam to apply heat to reflow one of the discrete masses of conductive element material, including the at least one of the discrete masses of conductive element material, in the flux or to simultaneously reflow a group of the discrete masses of conductive element material, including the at least one of the discrete masses of conductive element material, in the flux.

17. The system of claim 13, wherein the laser is configured to emit the laser beam at an average power of about 120 W or less.

18. The system of claim 13, wherein the laser is configured to pulse the laser beam while directing the laser beam toward the surface of a semiconductor structure.

* * * * *